(12) United States Patent
Lee et al.

(10) Patent No.: US 12,556,158 B2
(45) Date of Patent: Feb. 17, 2026

(54) ACOUSTIC RESONATOR PACKAGE

(71) Applicant: SAMSUNG ELECTRO-MECHANICS CO., LTD., Suwon-si (KR)

(72) Inventors: Tae Kyung Lee, Suwon-si (KR); Sung Han, Suwon-si (KR); Jae Goon Aum, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 1097 days.

(21) Appl. No.: 17/554,326

(22) Filed: Dec. 17, 2021

(65) Prior Publication Data
US 2023/0008635 A1     Jan. 12, 2023

(30) Foreign Application Priority Data
Jul. 9, 2021    (KR) .................. 10-2021-0090214

(51) Int. Cl.
*H03H 9/17*  (2006.01)
*H03H 9/10*  (2006.01)
(52) U.S. Cl.
CPC ............ *H03H 9/105* (2013.01); *H03H 9/173* (2013.01)
(58) Field of Classification Search
CPC .......................... H03H 9/105; H03H 9/173
See application file for complete search history.

(56) References Cited

U.S. PATENT DOCUMENTS

| | | | |
|---|---|---|---|
| 2006/0071324 A1 | 4/2006 | Lu et al. | |
| 2016/0064811 A1* | 3/2016 | Yota | H01L 24/13 |
| | | | 257/737 |
| 2017/0244379 A1* | 8/2017 | Yang | H03H 9/173 |
| 2018/0123557 A1* | 5/2018 | Sung | B81B 7/0064 |
| 2019/0020327 A1* | 1/2019 | Shealy | H03H 9/0095 |

(Continued)

FOREIGN PATENT DOCUMENTS

| | | |
|---|---|---|
| CN | 110581697 A | 12/2019 |
| CN | 112039455 A | 12/2020 |

(Continued)

OTHER PUBLICATIONS

Taiwanese Office Action issued on Jul. 19, 2022, in counterpart Taiwanese Patent Application No. 110139212 (6 pages in English and 5 pages in Chinese).

(Continued)

*Primary Examiner* — Bryan P Gordon
(74) *Attorney, Agent, or Firm* — NSIP Law

(57) ABSTRACT

An acoustic resonator package includes: a substrate; an acoustic resonator disposed on the substrate; a cap disposed on the substrate and the acoustic resonator; and a bonding portion bonding the substrate and the cap to each other. The cap includes a central portion accommodating the acoustic resonator, and an outer portion disposed outside of the central portion and having a bonding surface. The outer portion includes protrusions in contact with the bonding portion, and at least one trench disposed between the protrusions. The acoustic resonator package further includes a first protective layer and a second protective layer, the first protective layer and the second protective layer being disposed on a region of the bonding surface formed on each of the protrusions.

25 Claims, 7 Drawing Sheets

(56) References Cited

U.S. PATENT DOCUMENTS

| | | | |
|---|---|---|---|
| 2019/0379349 | A1 | 12/2019 | Lee et al. |
| 2019/0393850 | A1 | 12/2019 | Yong et al. |
| 2020/0021265 | A1* | 1/2020 | Lee .................. H03H 9/173 |
| 2020/0177155 | A1* | 6/2020 | Park .................. H03H 9/0542 |
| 2021/0218381 | A1 | 7/2021 | Lou et al. |

FOREIGN PATENT DOCUMENTS

| | | |
|---|---|---|
| JP | 8-213874 A | 8/1996 |
| KR | 10-2017-0114433 A | 10/2017 |
| KR | 10-2018-0048239 A | 6/2018 |
| KR | 10-2020-0000058 A | 1/2020 |
| KR | 10-2020-0007545 A | 1/2020 |
| TW | 201946396 A | 12/2019 |

OTHER PUBLICATIONS

Korean Office Action issued on Mar. 24, 2025 in corresponding Korean Patent Application No. 10-2021-0090214. (8 pages in English and 7 pages in Korean).

Chinese Office Action issued on Dec. 26, 2025, in counterpart Chinese Patent Application No. 202210279111.5. (10 pages in English, 12 pages in Chinese).

\* cited by examiner

ACOUSTIC RESONATOR PACKAGE

CROSS-REFERENCE TO RELATED APPLICATIONS

This application claims the benefit under 35 U.S.C. § 119(a) of Korean Patent Application No. 10-2021-0090214 filed on Jul. 9, 2021 in the Korean Intellectual Property Office, the entire disclosure of which is incorporated herein by reference for all purposes.

BACKGROUND

1. Field

The following description relates to an acoustic resonator package.

2. Description of Related Art

With the recent rapid development of mobile communication devices, chemical and biological devices, and the like, demand for small and lightweight filters, oscillators, resonant elements, acoustic resonant mass sensors, or the like, used in such devices, is also increasing.

A film bulk acoustic resonator (FBAR) is known as a device for implementing small and lightweight filters, oscillators, resonant elements, acoustic resonant mass sensors, and the like. The FBAR may provide advantages, because the FBAR may be mass-produced at minimal cost and may be implemented in a very small size. In addition, the FBAR may implement a high quality factor (Q) value, which is a main characteristic of the filter, and may be used in microfrequency bands, especially in personal communication system (PCS) bands and digital cordless system (DCS) bands.

In general, the FBAR may have a structure including a resonance portion implemented by sequentially stacking a first electrode, a piezoelectric layer, and a second electrode on a substrate.

When electrical energy is applied to the first and second electrodes to induce an electric field in the piezoelectric layer, the electric field may induce a piezoelectric phenomenon in the piezoelectric layer to vibrate the resonance portion in a predetermined direction. As a result, a bulk acoustic wave may be generated in a direction corresponding to a vibration direction, to cause resonance. That is, the FBAR may be an element using a bulk acoustic wave (BAW), and as an effective electromechanical coupling coefficient (Kt2) of the piezoelectric layer increases, a frequency characteristic of an acoustic wave element may be improved and broadband may be possible.

Further, when the FBAR is packaged and used, hermeticity of the package may greatly affect reliability of the FBAR.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic resonator package includes: a substrate; an acoustic resonator disposed on the substrate; a cap disposed on the substrate and the acoustic resonator; and a bonding portion bonding the substrate and the cap to each other. The cap includes a central portion accommodating the acoustic resonator, and an outer portion disposed outside of the central portion and having a bonding surface. The outer portion includes protrusions in contact with the bonding portion, and at least one trench disposed between the protrusions. The acoustic resonator package further includes a first protective layer and a second protective layer, the first protective layer and the second protective layer being disposed on a region of the bonding surface formed on each of the protrusions.

A thickness difference between the outer portion and the central portion may be greater than a depth of the at least one trench.

The first protective layer may be a conductive layer including any one or any combination of any two or more of chromium (Cr), titanium (Ti), titanium nitride (TiN), tantalum (Ta), tantalum nitride (TaN), nickel (Ni), molybdenum (Mo), and titanium tungsten (TiW).

The second protective layer may include either one or both of an oxide of Si, Al, or Ti and a nitride of Si, Al, or Ti.

An average thickness of the second protective layer may be less than ½ of an average width of the trench.

The first protective layer may be disposed only on the region of the bonding surface formed on each of the protrusions.

The second protective layer may be disposed inside the trench.

The first protective layer may be disposed on a region of the bonding surface formed inside the trench.

The second protective layer may entirely cover the first protective layer.

The bonding portion may entirely cover the first protective layer.

The first protective layer may be disposed between the bonding surface and the second protective layer.

The first protective layer may be disposed on the second protective layer.

The bonding portion may not include an alloy.

In another general aspect, an acoustic resonator package includes: a substrate; an acoustic resonator disposed on the substrate; a cap disposed on the substrate and the acoustic resonator; a bonding portion bonding the substrate and the cap to each other; and a through-silicon via (TSV) hole passing through the cap. The cap includes a central portion accommodating the acoustic resonator, and a connection portion having a bonding surface connected to the bonding portion. The connection portion includes protrusions disposed to contact the bonding portion, and at least one trench disposed between the protrusions. The acoustic resonator package further includes a first protective layer and a second protective layer, disposed on a region of the bonding surface formed on each of the protrusions.

The TSV hole may include a connection electrode. The connection electrode may be in contact with the bonding portion.

The TSV hole may include a connection electrode. The second protective layer may extend between the connection electrode and the connection portion.

An average thickness of the second protective layer may be less than ½ of an average width of the trench.

The bonding portion may not include an alloy.

The first protective layer may be disposed only on the region of the bonding surface formed on each of the protrusions.

The acoustic resonator package of claim 14, wherein the second protective layer is disposed inside the trench.

The first protective layer may be disposed on a region of the bonding surface formed inside the trench.

The second protective layer may entirely cover the first protective layer.

The bonding portion may entirely cover the first protective layer.

The first protective layer may be disposed between the bonding surface and the second protective layer.

The first protective layer may be disposed on the second protective layer.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
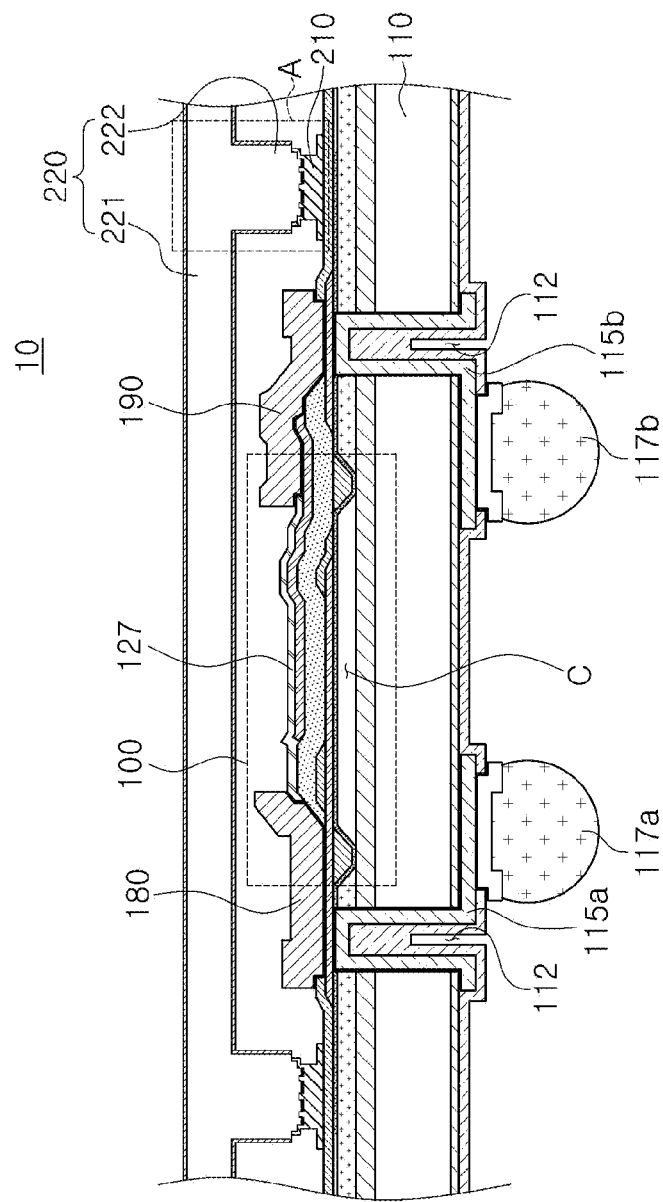
FIG. 1 is a cross-sectional view illustrating an acoustic resonator package, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is to be noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
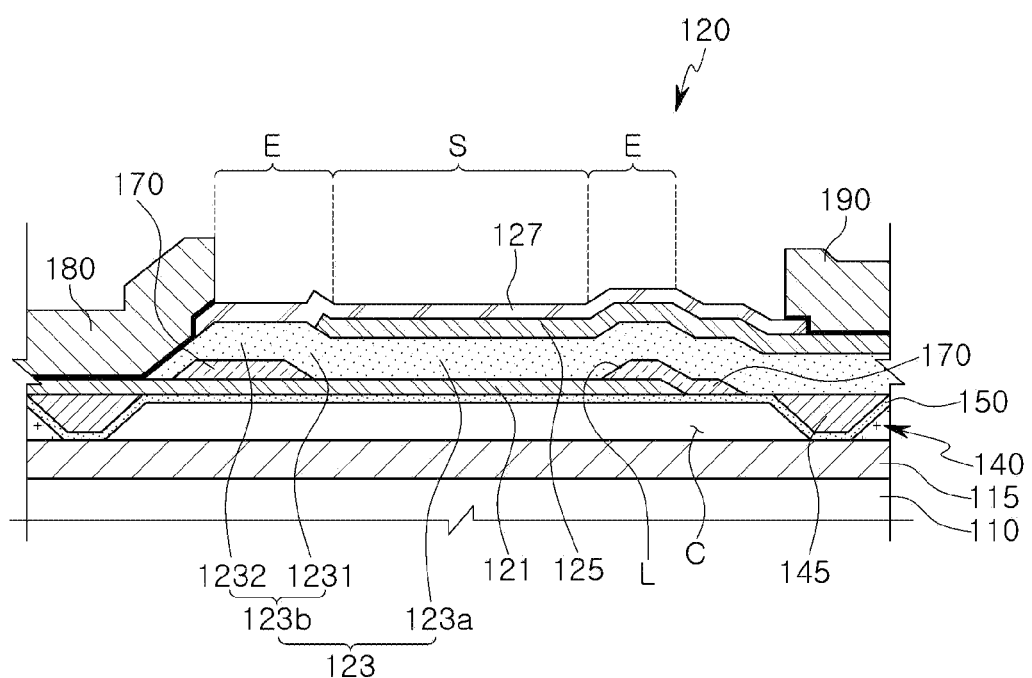
FIG. 2 is an enlarged cross-sectional view of a portion of an acoustic resonator of FIG.
Figure 3:
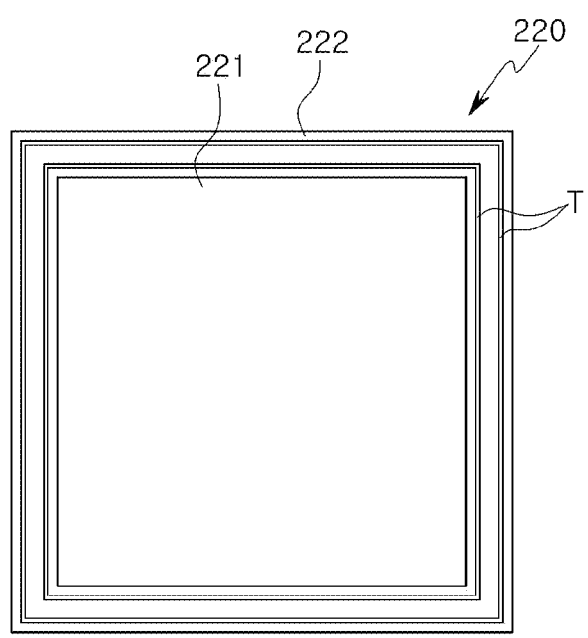
FIG. 3 is a plan view in which a cap of FIG. 1 is viewed from a lower portion thereof.
Figure 4:
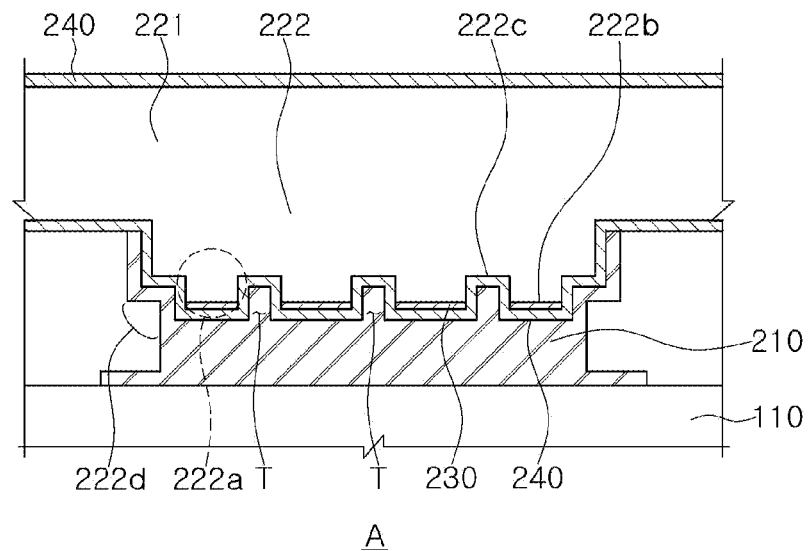
FIG. 4 is an enlarged view of a region A of FIG. 1.
Figure 5:
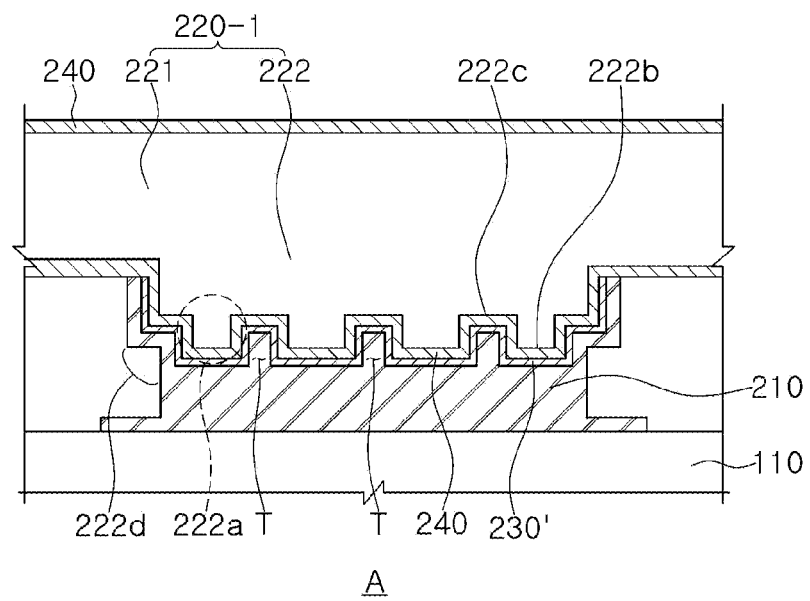
FIG. 5 is a view illustrating a modified form of FIG. 4.
Figure 6:
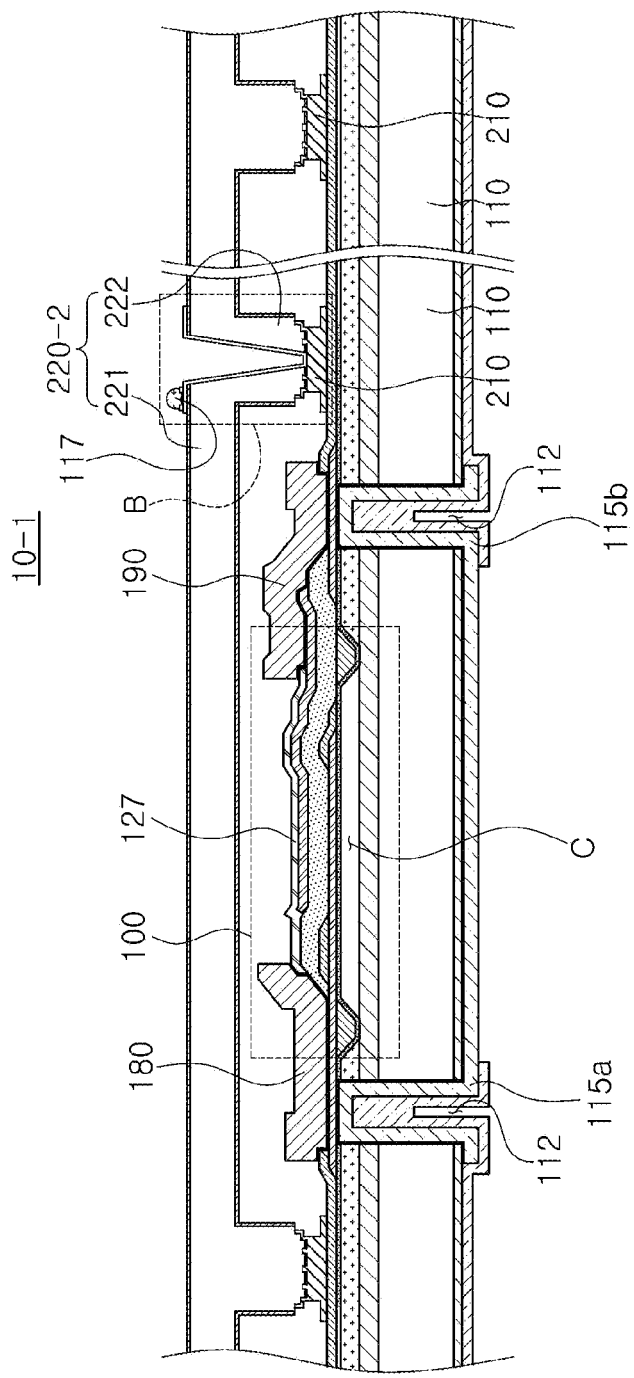
FIG. 6 is a view illustrating an acoustic resonator package, according to another embodiment.

FIG. 1 is a cross-sectional view illustrating an acoustic resonator package 10, according to an embodiment. FIG. 2 is an enlarged cross-sectional view of a portion of an acoustic resonator 100 of FIG. 1. FIG. 3 is a plan view in which a cap 220 of FIG. 1 is viewed from a lower portion thereof. FIG. 4 is an enlarged view of a region A of FIG. 1. FIG. 5 is a view illustrating a modified form of FIG. 4.

Referring to FIGS. 1 to 4, the acoustic resonator package 10 may include, for example, a substrate 110, an acoustic resonator 100, a cap 220, and a bonding portion 210. The cap 200 may include a central portion 221 accommodating the acoustic resonator 100, and an outer portion 222 disposed outside of the central portion 221 and having a bonding surface 222b. The outer portion 222 may include protrusions 222a disposed to contact the bonding portion 210, and at least one trench T disposed between the protrusions 222a.

A first protective layer 230 and a second protective layer 240 may be disposed on a region of the bonding surface 222b formed on the protrusion 222a. In general, since acoustic resonators may be vulnerable to moisture, the cap 220 and the substrate 110 may be required to have high hermeticity. A thermocompression bonding method of compressing a metal under conditions of high temperature and high pressure may be used as a method of bonding the cap and the substrate. The protrusion 222a and the trench T of the outer portion 222 may perform a function of increasing bonding strength when the thermocompression bonding method is applied. In this case, during the thermocompression bonding process, silicon, which is a material of the cap and the substrate, may be exposed to react with the metal, which forms the bonding portion 210, or to diffuse the metal component, to generate defects. The acoustic resonator package 10 may include the first protective layer 230 and the second protective layer 240 disposed on the protrusion 222a contacting the bonding portion 210, to prevent the silicon of the cap 220 and/or the substrate 110 from contacting the metal of the bonding portion 210, and to minimize occurrence of defects in regions to be bonded, thereby improving hermeticity of the cap 220 and/or the substrate 110.

The acoustic resonator 100 may be a film bulk acoustic resonator (FBAR). Hereinafter, the film bulk acoustic resonator will be described as an example. The acoustic resonator 100 may include the substrate 110, an insulating layer 115, a membrane layer 150, a cavity C, a resonant unit 120, and a cover layer 127.

The substrate 110 may be a silicon substrate. For example, a silicon wafer or a silicon on insulator (SOI) type substrate may be used as the substrate 110. The insulating layer 115 may be disposed on an upper surface of the substrate 110, to electrically isolate the substrate 110 from the resonant unit 120. In addition, the insulating layer 115 may prevent the substrate 110 from being etched by etching gas when the cavity C is formed during a manufacturing process of the acoustic resonator 100. In this case, the insulating layer 115 may be formed of any one or any combination of any two or more of silicon dioxide ($SiO_2$), silicon nitride ($Si_3N_4$), aluminum oxide ($Al_2O_3$), or aluminum nitride (AlN), and may be formed on the substrate 110 by chemical vapor deposition, RF magnetron sputtering, or evaporation.

A sacrificial layer 140 may be formed on the insulating layer 115, and the cavity C and an etch stop layer 145 may be disposed inside the sacrificial layer 140. The cavity C may be an empty space, and may be formed by removing a portion of the sacrificial layer 140. Since the cavity C is formed in the sacrificial layer 140, the resonant unit 120, which is formed on the sacrificial layer 140, may be formed to be entirely planar. The etch stop layer 145 may be disposed along a boundary of the cavity C. The etch stop layer 145 may prevent etching from proceeding beyond a cavity region during a process of forming the cavity C. Therefore, a horizontal area of the cavity C may be defined by the etch stop layer 145, and a vertical area of the cavity C may be defined by a thickness of the sacrificial layer 140.

The membrane layer 150 may be formed on the sacrificial layer 140 to define a thickness (or a height) of the cavity C, together with the substrate 110. Therefore, the membrane layer 150 may also be formed of a material that may not be easily removed during the process of forming the cavity C. For example, when a halide-based etching gas such as fluorine (F), chlorine (Cl), or the like is used to remove a portion (e.g., a region of the cavity) of the sacrificial layer 140, the membrane layer 150 may be formed of a material having low reactivity with the above-described etching gas. In this case, the membrane layer 150 may include at least one of silicon dioxide ($SiO_2$) or silicon nitride ($Si_3N_4$). In addition, the membrane layer 150 may be a dielectric layer containing any one or any combination of any two or more of manganese oxide (MnO), magnesium oxide (MgO), zirconium oxide ($ZrO_2$), aluminum nitride (AlN), lead zirconium titanate (PZT), gallium arsenide (GaAs), hafnium oxide ($HfO_2$), aluminum oxide ($Al_2O_3$), titanium oxide ($TiO_2$), and zinc oxide (ZnO), or may be a metal layer containing any one or any combination of any two or more of aluminum (Al), nickel (Ni), chromium (Cr), platinum (Pt), gallium (Ga), and hafnium (Hf). However, the membrane layer is not limited to the foregoing examples.

A seed layer (not illustrated) formed of aluminum nitride (AlN) may be formed on the membrane layer 150. Specifically, the seed layer may be disposed between the membrane layer 150 and a first electrode 121. The seed layer may be formed using a dielectric material or a metal having an HCP structure, in addition to AlN. In an example in which the seed layer is formed using a metal, the seed layer may be formed of titanium (Ti). The resonant unit 120 may include the first electrode 121, a piezoelectric layer 123, and a second electrode 125. In the resonant unit 120, the first electrode 121, the piezoelectric layer 123, and the second electrode 125 may be sequentially stacked from the bottom of the resonant unit. Therefore, in the resonant unit 120, the piezoelectric layer 123 may be disposed between the first electrode 121 and the second electrode 125.

Since the resonant unit 120 may be formed on the membrane layer 150, the membrane layer 150, the first electrode 121, the piezoelectric layer 123, and the second electrode 125 may be sequentially stacked on the substrate 110 to form the resonant unit 120. The resonant unit 120 may resonate the piezoelectric layer 123, according to a signal applied to the first electrode 121 and the second electrode 125, to generate a resonant frequency and an anti-resonant frequency. When an insertion layer 170, which will be described later, is formed, the resonant unit 120 may be divided into a central portion S in which the first electrode 121, the piezoelectric layer 123, and the second electrode 125 are stacked to be approximately planar, and an extended portion E in which the insertion layer 170 is interposed between the first electrode 121 and the piezoelectric layer 123. The central portion S may be a region disposed around a center of the resonant unit 120, and the extended portion E may be a region disposed along an edge of the central portion S. Therefore, the extended portion E may refer to a region extending outwardly from the central portion S. The insertion layer 170 may have an inclined surface L of which thickness increases as a distance from the central portion S increases. In the extended portion E, the piezoelectric layer 123 and the second electrode 125 may be disposed on the insertion layer 170. Therefore, portions of the piezoelectric layer 123 and the second electrode 125 located in the extended portion E, may have inclined surfaces along a shape of the insertion layer 170.

In this embodiment, the extended portion E may be defined to be included in the resonant unit 120. Therefore, resonance may also be generated in the extended portion E. However, the present disclosure is not limited thereto, and, depending on a structure of the extended portion E, resonance may not occur in the extended portion E, and resonance may be generated only in the central portion S. The first electrode 121 and the second electrode 125 may be formed of a conductor, and, for example, may be formed of a metal including any one or any combination of any two or more of gold, molybdenum, ruthenium, iridium, aluminum, platinum, titanium, tungsten, palladium, tantalum, chromium, and nickel, but is not limited thereto. In the resonant unit 120, the first electrode 121 may have an area larger than an area of the second electrode 125, and a first metal layer 180 may be formed on the first electrode 121 along an outer edge of the first electrode 121. Therefore, the first metal layer 180 may be disposed to surround the second electrode 125.

Since the first electrode 121 may be disposed on the membrane layer 150, the first electrode 121 may be formed to be entirely planar. Since the second electrode 125 may be disposed on the piezoelectric layer 123, the second electrode 125 may be formed to be bent, corresponding to a shape of the piezoelectric layer 123. The second electrode 125 may be disposed throughout an entirety of the central portion S, and may be partially disposed in the extended portion E. Therefore, the second electrode 125 may include a portion disposed on a piezoelectric portion 123a of the piezoelectric layer 123 to be described later, and a portion disposed on a bent portion 123b of the piezoelectric layer 123. For example, in an embodiment, the second electrode 125 may be disposed to entirely cover the piezoelectric portion 123a and partially cover an inclined portion 1231 of the piezoelectric layer 123. Therefore, a portion of the second electrode 125 disposed in the extended portion E may have an area smaller than an area of an inclined surface of the inclined portion 1231, and a portion of the second electrode 125 in the resonant unit 120 may be formed to have an area smaller than an area of the piezoelectric layer 123.

The piezoelectric layer 123 may be formed on the first electrode 121. When the insertion layer 170 to be described later is formed, the piezoelectric layer 123 may be formed on the first electrode 121 and the insertion layer 170. Zinc oxide (ZnO), aluminum nitride (AlN), doped aluminum nitride, lead zirconate titanate, quartz, or the like may be selectively used as a material of the piezoelectric layer 123. The doped aluminum nitride may further include a rare earth metal, a transition metal, or an alkaline earth metal. For example, the rare earth metal may include any one or any combination of any two or more of scandium (Sc), erbium (Er), yttrium (Y), and lanthanum (La), and an amount of the rare earth metal may be 1 to 20 at %. The transition metal may include any one or any combination of any two or more of hafnium (Hf), titanium (Ti), zirconium (Zr), tantalum (Ta), and niobium (Nb). The alkaline earth metal may include magnesium (Mg).

The piezoelectric layer 123 may include the piezoelectric portion 123a disposed in the central portion S, and the bent portion 123b disposed in the expanded portion E. The piezoelectric portion 123a may be a portion directly stacked on an upper surface of the first electrode 121. Therefore, the piezoelectric portion 123a may be interposed between the first electrode 121 and the second electrode 125 to form a planar shape, together with the first electrode 121 and the second electrode 125. The bent portion 123b may be a region extending outwardly from the piezoelectric portion 123a and located within the extended portion E. The bent portion 123b may be disposed on the insertion layer 170, to be described later, and may have a raised shape along a shape of the insertion layer 170. Therefore, the piezoelectric layer 123 may be bent at a boundary between the piezoelectric portion 123a and the bent portion 123b, and the bent portion 123b may be raised to correspond to a thickness and a shape of the insertion layer 170. The bent portion 123b may include the inclined portion 1231 and an extended portion 1232. The inclined portion 1231 may be a portion formed to be inclined along the inclined surface L of the insertion layer 170. In addition, the extended portion 1232 may be a portion extending outwardly from the inclined portion 1231. The inclined portion 1231 may be formed parallel to the inclined surface L of the insertion layer 170, and an inclination angle of the inclined portion 1231 may be identical to, or substantially identical to an inclination angle of the inclined surface L of the insertion layer 170.

The insertion layer 170 may be disposed along a surface formed by the membrane layer 150, the first electrode 121, and the etch stop layer 145. The insertion layer 170 may be disposed around the central portion S to support the bent portion 123b of the piezoelectric layer 123. Therefore, the bent portion 123b of the piezoelectric layer 123 may include the inclined portion 1231 and the extended portion 1232, according to a shape of the insertion layer 170. The insertion layer 170 may be disposed in a region except for the central portion S. For example, the insertion layer 170 may be entirely disposed in a region except for the central portion S, or may be partially disposed in the region.

Also, at least a portion of the insertion layer 170 may be disposed between the piezoelectric layer 123 and the first electrode 121. A side surface of the insertion layer 170 disposed along a boundary of the central portion S may be formed to have a thickness increasing as a distance from the central portion S increases. For this reason, the insertion layer 170 may be formed as the inclined surface L in which a side surface disposed adjacent to the central portion S has a constant inclination angle. If the inclination angle of the side surface of the insertion layer 170 were formed to be narrower than 5°, in order to manufacture the insertion layer 170, a thickness of the insertion layer 170 may be formed to be very thin or an area of the inclined surface L may be formed to be excessively large. Therefore, there may be problems in that the above configurations are difficult to be practically implemented.

In addition, if the inclination angle of the side surface of the insertion layer 170 were greater than 70°, an inclination angle of the inclination portion 1231 of the piezoelectric layer 123 stacked on the insertion layer 170 may be greater than 70°. In this case, since the piezoelectric layer 123 may be excessively bent, cracks may occur in the bent portion of the piezoelectric layer 123. Therefore, in an embodiment, the inclination angle of the inclined surface L may be formed in a range of 5° to and 70°. The insertion layer 170 may be formed of a material such as silicon oxide ($SiO_2$), aluminum nitride (AlN), aluminum oxide ($Al_2O_3$), silicon nitride (SiN), magnesium oxide (MgO), zirconium oxide ($ZrO_2$), or the like, but may be formed of a material different from that of the piezoelectric layer 123. In addition, as necessary, a region in which the insertion layer 170 is provided may be formed as a void (e.g., air). The void may be implemented by removing a portion of the insertion layer 170 after all resonant units 120 are formed during the manufacturing process. In an embodiment, a thickness of the insertion layer 170 may be the same as or similar to a thickness of the first electrode 121. Also, the thickness of the insertion layer 170 may be less than a thickness of the piezoelectric layer 123. When the thickness of the insertion layer 170 is less than the thickness of the piezoelectric layer 123, an inclined portion of the piezoelectric layer 123 may be formed due to the insertion layer, and cracks may not occur, thereby contributing to improvement of resonator performance. A lower limit of the thickness of the insertion layer 170 does not need to be particularly limited, but the thickness of the insertion layer 170 may be 100Ê or more in order to easily control a deposition thickness, and secure thickness uniformity in a deposited wafer.

The resonant unit 120 may be spaced apart from the substrate 110 through the cavity C, which is formed as an empty space. The cavity C may be formed by supplying an etching gas (or an etching solution) to an inlet hole to remove a portion of the sacrificial layer 140 in a process of manufacturing the acoustic resonator 100. The cover layer 127 may be disposed along a surface of the acoustic resonator 100 to protect the acoustic resonator 100 from outside elements. The cover layer 127 may be disposed along a surface formed by the second electrode 125, the bent portion 123b of the piezoelectric layer 123, and the insertion layer 170. The cover layer 127 may be formed of any one insulating material among a silicon oxide-based insulating material, a silicon nitride-based insulating material, an aluminum oxide-based insulating material, and an aluminum nitride-based insulating material. In addition, another cover layer 127 may be disposed on the substrate 110 between the acoustic resonator 100 and the bonding portion 210.

The first electrode 121 and the second electrode 125 may be formed to extend outside the resonant unit 120, and the first metal layer 180 and a second metal layer 190 may be respectively disposed on an upper surface of the extended portion E. The first metal layer 180 and the second metal layer 190 may be formed of a material such as gold (Au), a gold-tin (Au—Sn) alloy, copper (Cu), a copper-tin (Cu—Sn) alloy, aluminum (Al), an aluminum-germanium (Al—Ge) alloy, or the like. The first metal layer 180 and the second metal layer 190 may function as a connection wire for electrically connecting electrodes of another acoustic resonator disposed adjacent to the first and second electrodes 121 and 125 of the acoustic resonator 100, or may function as a connection terminal of the first and second electrodes 121 and 125. However, this disclosure is not limited to the foregoing examples. Although FIG. 1 illustrates a case in which the insertion layer 170 is removed below the second metal layer 190, the disclosure is not limited to this configuration. For example, a structure in which the insertion layer 170 is disposed below the second metal layer 190 may be implemented, as necessary. The first metal layer 180 may pass through the insertion layer 170 and the cover layer 127 to be bonded to the first electrode 121. Also, as illustrated in FIG. 2, the first electrode 121 may have an area larger than an area of the second electrode 125, and the first metal layer 180 may be formed on a peripheral region of the first electrode 121. Therefore, the first metal layer 180 may be disposed around the resonant unit 120, and may be disposed to surround the second electrode 125.

As described above, the second electrode 125 may be stacked on the piezoelectric portion 123a and the inclined portion 1231 of the piezoelectric layer 123. In addition, a portion of the second electrode 125 disposed on the inclined portion 1231 of the piezoelectric layer 123, e.g., a portion of the second electrode 125 disposed in the expanded portion E, may be disposed on only a portion of an inclined surface of the inclined portion 1231, rather than the entirety of the inclined surface of the inclined portion 1231.

The cap 220 may be disposed on the substrate 110 and the acoustic resonator 100, and may be bonded to the substrate 110 by the bonding portion 210. The cap 220 may be provided to protect the acoustic resonator 100 from an external environment, and may be formed to have a cover form having an internal space in which the acoustic resonator 100 is accommodated. For example, as illustrated in FIG. 1, the cap 220 may include the central portion 221 accommodating the acoustic resonator 100, and the outer portion 222 disposed outside of the central portion 221 and connected to the bonding portion 210. In this case, the outer portion 222 may be implemented to be thicker than the central portion 221. A material constituting the cap 220 is not particularly limited, and the cap 220 may be, for example, a silicon wafer.

In an embodiment, the outer portion 222 of the cap 220 may include the protrusions 222a disposed to contact the bonding portion 210, and at least one trench T disposed between the protrusions 222a. The trench T may be a region partitioned by the protrusion 222a, as illustrated in FIGS. 1 and 3. The at least one trench T may be disposed in an outer portion 222. In the acoustic resonator package 10, the substrate 110 and the cap 220 may be coupled by the bonding portion 210. The bonding portion 210 may be formed of a metal, as described in more detail later, and, for example, may be formed by depositing gold (Au) on the substrate 110, depositing gold (Au) on the cap 220, and then thermocompression bonding the substrate 110 and the cap 220. Since metal materials used in the thermocompression bonding method are bonded without being liquefied, a pressure and a temperature for thermocompression bonding may be also applied to the substrate 110 and the cap 220. The trench T and the protrusions 222a may function to reduce the temperature and the pressure applied to the substrate 110 and the cap 220 in the thermocompression bonding process.

In an embodiment, a thickness difference between the outer portion 222 and the central portion 221, e.g., a depth of the cavity formed in the central portion 221, may be greater than a depth of the trench T. This configuration may be implemented in a process of forming the cavity and the trench T of the central portion 221 by the same etching process. The depth of the trench T may vary, depending on a size of the package 10, a size of the cap 220, or the like, but should be thinner than a thickness of a metal forming the bonding portion 210. When the depth of the trench T is excessively deep, hermeticity may be adversely affected, such as occurrence of voids or the like, when the metal of the bonding portion 210 is deposited.

The cap 220 may include the first protective layer 230 covering a surface forming the protrusion 222a. The first protective layer 230 may function to prevent defects that may occur due to component diffusion between the silicon wafer and the bonding portion 210 in a bonding process of the bonding portion 210 to be described later. In this manner, when a defect occurs in the bonding portion 210, a bonding force between the cap 220 and the substrate 110 may be lowered. Therefore, hermeticity of the package 10 may be lowered and reliability thereof may also be lowered. In addition, the first protective layer 230 may function to improve bonding strength with a metal component forming the bonding portion 210.

A conductive layer including any one or any combination of any two or more of chromium (Cr), titanium (Ti), titanium nitride (TiN), tantalum (Ta), tantalum nitride (TaN), nickel (Ni), molybdenum (Mo), and titanium tungsten (TiW) may be used as the first protective layer 230. The conductive layer constituting the first protective layer 230 may have good compatibility with the metal constituting the bonding portion 210, and may effectively suppress diffusion of the metal component included in the bonding portion 210 while maintaining excellent adhesion.

In an example, the first protective layer 230 may be disposed on the outer portion 222 of the cap, and may be disposed only on the regions of the bonding surface 222b formed on the protrusions 222a of the outer portion 222. Referring to FIG. 4, the first protective layer 230 may be disposed on the regions of the bonding surface 222b formed on the protrusions 222a, and may not be disposed on a region other than the regions of the bonding surface 222b formed on the protrusions 222a. The configuration of this example may be made by first forming the first protective layer 230 on a surface of the cap 220 and then etching the cap 220 to form the trench T and the cavity. In the etching process of the cap, the first protective layer 230 formed on the trench T and the cavity may be removed to form the configuration.

Referring to FIG. 5, in another example, a first protective layer 230' may be disposed on a surface of the protrusion 222a of the outer portion 222 of a cap 220-1 and in an internal space of the trench T. The first protective layer 230' may be disposed on the surface of the plurality of protrusions 222a, and may be disposed in the internal space of the trench T partitioned by the plurality of protrusions 222a, at the same time. The first protective layer 230' may be disposed on a sidewall of the internal space of the trench T, and may be disposed on a bottom surface 222c of the trench T. The first protective layer 230' may, for example, be disposed to contact the sidewall and bottom surface 222c of the trench T, and may be disposed to contact other layers disposed on the sidewall and bottom surface 222c as described later, but is not limited to such a configuration. The configuration of this example may be made by first forming the trench T and the cavity of the cap 220-1, and then forming the first protective layer 230 thereon.

In an embodiment, the cap 220 may include the second protective layer 240 covering a surface forming the protrusion 222a. The second protective layer 240 may be disposed on a region of the bonding surface 222b formed on the protrusion 222a, together with the first protective layer 230 described above.

In an embodiment, the second protective layer 240 may include either one or both of an oxide and a nitride of Si, Al, or Ti. The second protective layer 240 including either one or both of an oxide and a nitride of Si, Al, or Ti may be formed to conformally cover the internal space of the trench T while having a thin thickness, to effectively prevent spread of the metal component or the like.

In an example, the second protective layer 240 may be formed as a thermal diffusion silicon oxide film. In the case of the thermal diffusion silicon oxide, a high-temperature process may be required to form an oxide film. In addition, a process capable of conformally depositing the trench T and the protrusion 222a, such as CVD, ALD, MVD, or the like may be used to form the second protective layer 240.

In an example, the second protective layer 240 may be disposed in the internal space of the trench T formed in the bonding surface 222b of the cap 220, as shown in FIG. 4, which schematically illustrates the outer portion 222 of the cap 220. Referring to FIG. 4, when the trench T is formed by etching the cap on which the first protective layer 230 is formed as described above, a silicon wafer (Si) of the cap 220 may be exposed from the bottom surface 222c and the sidewall of the trench T, and defects may occur due to diffusion between the silicon wafer, exposed in the thermocompression bonding process, and the metal component of the bonding portion 210. The second protective layer 240 may be disposed in the internal space of the trench T, and may function to separate the silicon wafer and the metal component of the bonding portion 210 from each other. Therefore, defects that may occur during the thermocompression bonding process between the cap 220 and the substrate 110 may be prevented.

The configuration described in the above example may be made by first forming the first protective layer 230 on a surface of the cap 220, etching the cap 220 to form the trench T and the cavity, and then depositing the second protective layer 240. In the etching process of the cap 220, the first protective layer 230 formed on the trench T and the cavity may be removed, and the second protective layer 240 may be formed on the first protective layer 230 remaining on the region of the bonding surface 222b formed on the protrusion 222a and a surface of the exposed cap 220, to form the configuration.

In another example, the first protective layer 230' and the second protective layer 240 may be disposed together in the trench T, as shown in FIG. 5, which illustrates an outer portion 222 of the cap 220-1. Referring to FIG. 5, when a second protective layer 240 is disposed in a trench T of the cap 220-1, and then a first protective layer 230 is separately deposited, the first protective layer 230 and the second protective layer 240 may be disposed together on a surface of the protrusion 222a of an outer portion 222 of the cap 220-1 and in the trench T, and the first protective layer 230 may be disposed on a surface of the second protective layer 240, disposed on the protrusion 222a and in the trench T.

In an example, an average thickness of the second protective layer 240 may be less than or equal to ½ of an average width of the trench T. A thickness of the second protective layer 240 may be the shortest vertical distance from one surface of the second protective layer 240 to the other surface of the second protective layer 240, and the average thickness may refer to an arithmetic mean of thicknesses measured in a cross section passing through a center of the acoustic resonator 100. When the average thickness of the second protective layer 240 is more than ½ of the average width of the trench T, there may be problems in that it is difficult to form the desired trench T and the protrusion 222a, and bonding strength in thermocompression bonding may not be increased.

In an embodiment, the second protective layer 240 may be disposed to cover the first protective layer 230, as shown in FIG. 4. Referring to FIG. 4, the first protective layer 230 and the second protective layer 240 may be sequentially stacked on the bonding surface 222b of the protrusion 222a, and at least two protective layers may be disposed on the bonding surface 222b. The bonding surface 222b may be a surface coupled to the bonding portion 210, to be described in more detail later. When a silicon (Si) wafer is used as a cap and a bonding portion is formed of a metal such as gold (Au) or the like, silicon (Si) may diffuse into the bonding portion or gold (Au) may diffuse into the substrate 110 and/or the cap, to generate defects. Due to this, there may be problems in that bonding force between the cap and the substrate 110 may be lowered to deteriorate hermeticity. In the acoustic resonator package 10 according to this embodiment, the first protective layer 230 may be disposed on the bonding surface 222b, and the second protective layer 240 may be disposed on the first protective layer 230. Therefore, contact between the bonding portion 210 and the cap 220 during the bonding process may be minimized to improve reliability.

In another embodiment, as shown in FIG. 5, the first protective layer 230' may be disposed on the second protective layer 240. Referring to FIG. 5, the second protective layer 240 and the first protective layer 230' may be sequentially stacked on a bonding surface 222b of a protrusion 222a of a cap 220-1. In this case, the first protective layer 230' may be disposed to cover the second protective layer 240, and the first protective layer 230' may be disposed to contact the bonding portion 210. When the first protective layer 230' is disposed on the second protective layer 240, the first protective layer 230' may be disposed to cover at least a region in which the protrusion 222a of the outer portion 222 is formed. In addition, the first protective layer 230' may be disposed between the bonding portion 210 and the outer portion 222, the first protective layer 230' may be disposed on the outer portion 222, and the bonding portion 210 may be disposed to cover the first protective layer 230'.

The bonding portion 210 may bond the cap 220/220-1 and the substrate 110 as described above, to maintain hermeticity in the acoustic resonator package. The bonding portion 210 may include a metal.

In an example, the bonding portion 210 may not include an alloy. The expression of "the bonding portion 210 may not include an alloy" means that the bonding portion 210 may be formed of a same metal element, and refers that the bonding portion 210 may include only one metal element. The expression of "the bonding portion 210 may not include an alloy" means that the bonding portion 210 does not contain an alloy, and means that the bonding portion 210 may be completely formed of a single metal, but also includes a state in which other components may be partially present in the bonding portion 210 due to contamination or errors. The other components may be included, for example, in an amount of 10 wt % or less with respect to a main metal component constituting the bonding portion 210.

In the above example, the bonding portion 210 may include gold (Au). In this case, the bonding portion 210 may include other components, but gold (Au) may be a main metal component. In the case of a conventional acoustic resonator package, a bonding portion including an alloy composed of at least two types of metal components may be used. When an alloy is used, there may be an advantage in that it may be easy to control temperature or pressure conditions of a bonding process, but bonding strength of the bonding portion may be reduced because the bonding portion may not be formed uniformly. In the acoustic resonator package 10 according to this example, since the bonding portion 210 may be substantially formed of a single gold (Au) component, the bonding portion 210 may be uniformly formed, and hermeticity of the cap 220/220-1 may be further improved.

In an example, the bonding portion 210 may be disposed to entirely cover the protrusion 222a. Also, the bonding portion 210 may be disposed to entirely cover the first protective layer 230/230'. Referring to FIGS. 4 and 5, the bonding portion 210 may be disposed to entirely cover the protrusion 222a disposed on the outer portion 222 of the cap 220/220-1, and may be disposed to entirely cover the first protective layer 230/230' and the second protective layer 240 disposed on the bonding surface 222b of the protruding portion 222a. Since the bonding portion 210 is disposed to cover the protrusion 222a, bonding force between the cap 220/220-1 and the substrate 110 may be further improved.

In the above examples, the outer portion 222 of the cap 220/220-1 may include a groove portion 222d, and in this case, the bonding portion 210 may be disposed on the groove portion 222d of the outer portion 222. A portion of the bonding portion 210 may be disposed to contact the groove portion 222d of the outer portion 222, and the bonding portion 210 may be disposed to contact the entirety of the groove portion 222d of the outer portion 222, but is not limited to this configuration.

In an embodiment, as shown in FIG. 1, a plurality of via holes 112 passing through the substrate 110 may be disposed on a lower surface of the substrate 110. Connection conductors 115a and 115b may be formed in the via hole 112, and the connection conductors 115a and 115b may be formed on an inner surface of the via hole 112, e.g., disposed on an entirety of an inner wall of the via hole 112, but are not limited to this configuration. The connection conductors 115a and 115b may have one end connected to external electrodes formed on the lower surface of the substrate 110, and another end electrically connected to the first electrode 121 or the second electrode 125. For example, a first connection conductor 115a may connect the first electrode 121 and an external electrode to each other, and a second connection conductor 115b may connect the second electrode 125 and an external electrode to each other. In addition, the first connection conductor 115a and the second connection conductor 115b may be respectively connected to solder balls 117a and 117b for connection to an external substrate or the like. In FIG. 1, only two via holes 112 and two connection conductors 115a and 115b are illustrated and described, but the disclosure is not limited to this configuration. Greater numbers of via holes 112 and connection conductors 115a and 115b may be provided, as necessary.

Referring to FIGS. 6 to 10, in another embodiment, an acoustic resonator package 10-1 may include the substrate 110, the acoustic resonator 100, a cap 220-2/220-3/220-4/220-5', the bonding portion 210, and a through-silicon via (TSV) passing through the cap 220-2/220-3/220-4/220-5. The cap 220-2/220-3/220-4/220-5 may include a central portion 221 accommodating the acoustic resonator 100, and a connecting portion 223 disposed outside of the central portion 221 and on which a bonding surface 223b is disposed. The connecting portion 223 may include protrusions 223a disposed to contact the bonding portion 210, and at least one trench T disposed between the protrusions 223a. In this case, the first protective layer 230 and the second protective layer 240 may be disposed on regions of the bonding surface 223b formed on the protrusions 223a.

The through-silicon via (TSV) hole may include a connection electrode 250 disposed therein. The connection electrode 250 may be disposed in the through-silicon via (TSV) hole, and may be connected to the bonding portion 210. The acoustic resonator package 10-1 of this embodiment may be electrically connected to the outside through the connection electrode 250. The connection electrode 250 may include copper (Cu), but is not limited thereto.

Figure 7:
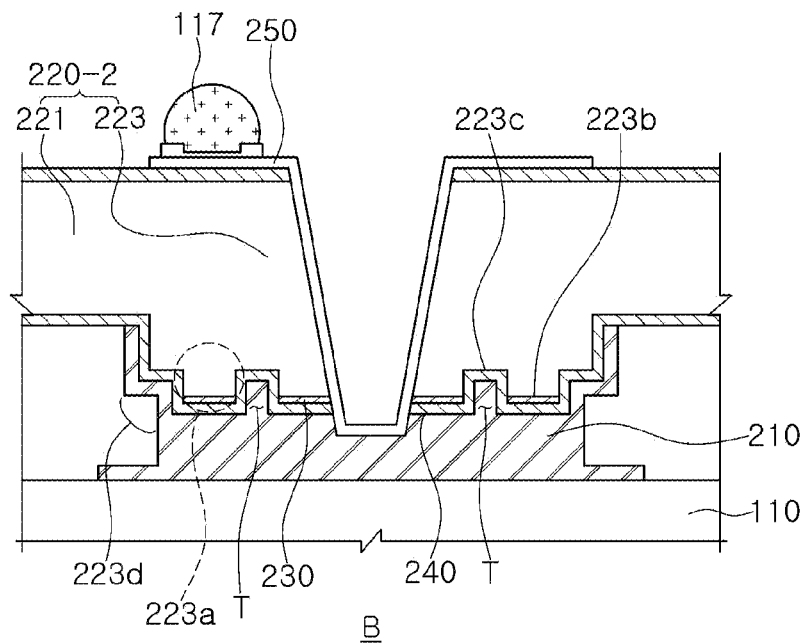
FIG. 7 is an enlarged view of a region B of FIG. 6.
Figure 9:
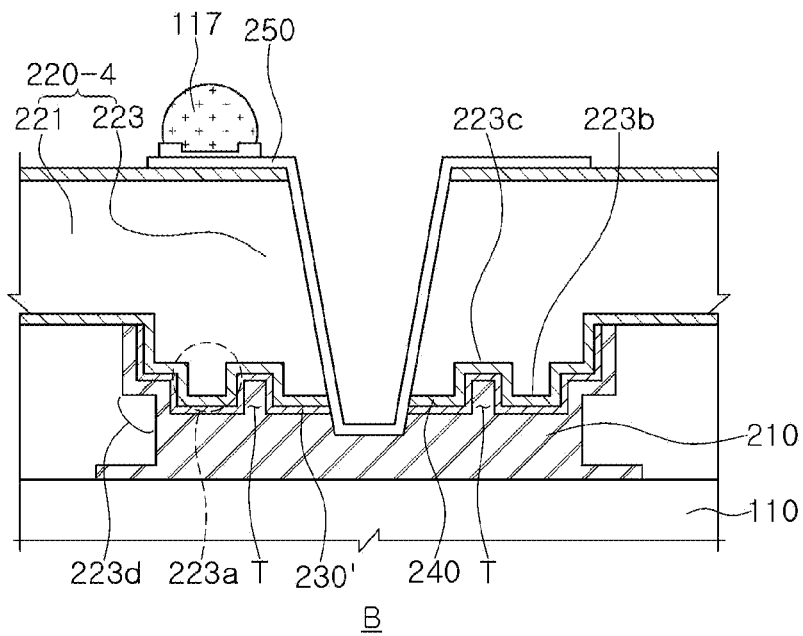

In an example, the connection electrode 250 disposed in the through-silicon via (TSV) hole may be disposed to contact the bonding portion 210. Referring to FIGS. 7 and 9, the connection electrode 250 may be disposed to be in direct contact with the bonding portion 210, and may be disposed to contact a portion of the first protective layer 230 and a portion of a second protective layer 240/240', arranged between the bonding portion 210 and a protrusion portion 223a, at the same time. Also, the connection electrode 250 may be connected to a solder ball 117 for connection to an external substrate or the like.

Figure 8:
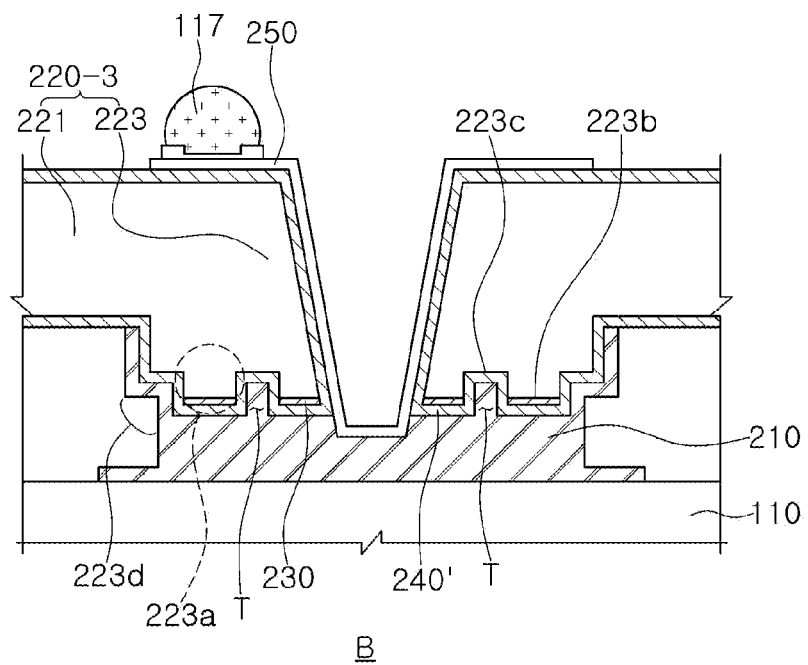
FIGS. 8 to 10 are views illustrating different modified forms of FIG. 7.

In an embodiment illustrated in FIG. 8, the second protective layer 240' may be extended and disposed between the connecting electrode 250 and the connecting portion 223. Referring to FIG. 8, the second protective layer 240' is disposed on the connection portion 223 of the cap 220-3 and may be disposed to extend into the through-silicon via (TSV) hole, for example, the second protective layer 240' may be disposed on a sidewall of the through-silicon via (TSV) hole. In this case, the second protective layer 240' may be disposed between the bonding portion 210 and the connection portion 223.

FIG. 7 illustrates the connection portion 223 of the acoustic resonator package 10' according to an embodiment. Referring to FIG. 7, the first protective layer 230 is disposed on the connection portion 223 of the cap 220-2 and may be disposed only on regions of the bonding surface 223b formed on the protrusion 223a of the connection portion 223.

FIG. 9 is a view schematically illustrating the connection portion 223 of an acoustic resonator package, according to another embodiment. Referring to FIG. 9, the first protective layer 230' is included in the connection portion 223 of the cap 220-4 may be disposed together between a bonding surface 223b of a protrusion 223a disposed in the connection portion 223 and a trench T. In this case, the first protective layer 230' may be disposed on a sidewall in the trench T, and may be disposed on a bottom surface 223c of the trench T.

In embodiments shown in FIGS. 7 and 8, the cap 220-2/220-3 may include the second protective layer 240/240' covering a surface forming the protrusion 223a. The second protective layer 240/240' may be disposed on a region of the bonding surface 223b formed on the protrusion 223a, together with the first protective layer 230 described above.

In the embodiments shown in FIGS. 7 and 9, the second protective layer 240 may be disposed in the trench T formed in the bonding surface 223b of the cap 220-2/220-4.

In the embodiments of FIGS. 7 and 8, the second protective layer 240/240' may be disposed to cover the first protective layer 230.

In the embodiments of FIGS. 7 and 8, the first protective layer 230 may be disposed between the bonding surface 223b and the second protective layer 240/240'.

Figure 10:
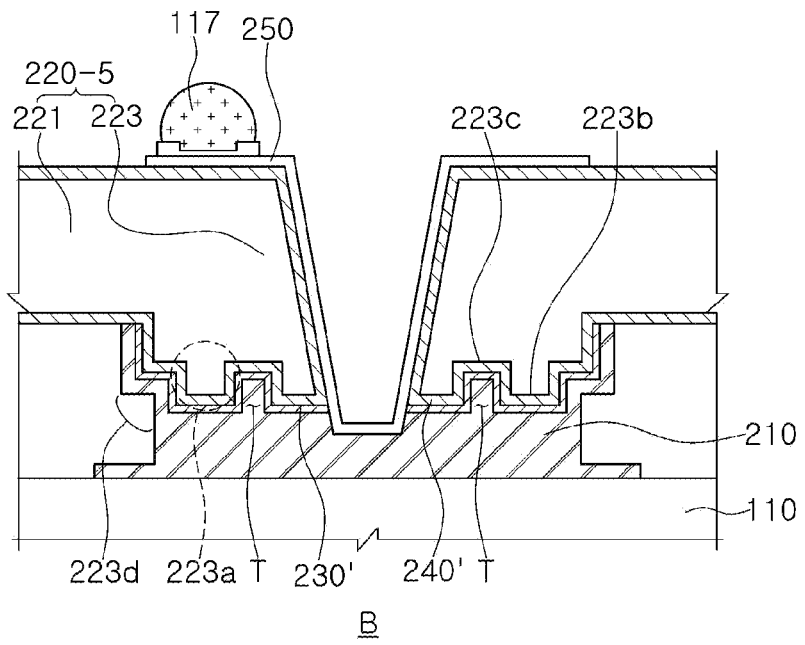

In another embodiment illustrated in FIG. 10, in the cap 220-5, the first protective layer 230' may be disposed on the second protective layer 240'. Referring to FIG. 10, the second protective layer 240' may be extended and disposed between the connecting electrode 250 and the connection portion 223. The second protective layer 240' may be disposed to extend into the through-silicon via (TSV) hole. For example, the second protective layer 240' may be disposed on a sidewall of the through-silicon via (TSV) hole. In this case, the second protective layer 240' may be disposed between the bonding portion 210 and the connection portion 223, and a first protective layer 230' may be disposed only between the second protective layer 240' and the bonding portion 210.

In the embodiments of FIGS. 6 to 10, an average thickness of the second protective layer 240/240' may be less than ½ of an average width of the trench T.

In an example, the bonding portion 210 may be disposed to entirely cover the first protective layer 230/230'.

In an embodiment, the bonding portion 210 may not include an alloy.

In an embodiment, the connection portion 223 of the cap 220-2/220-3/220-4/220-5 may include the groove portion 223d, and in this case, the bonding portion 210 may be disposed on the groove portion 223d.

Detailed descriptions of the substrate 110, the acoustic resonator 100, the cap 220-2/220-3/220-4/220-5, the bonding portion 210, the first protective layer 230/230', and the second protective layer 240/240' in FIGS. 6 to 10 may be the same as described above, and thus will be omitted.

An acoustic resonator package having the example structures disclosed herein may be employed to perform various functions. For example, a plurality of acoustic resonators may be disposed in an acoustic resonator package, and in this case, a ladder type filter structure, a lattice type filter structure, or a filter structure combining the plurality of acoustic resonators may be implemented.

One of various effects of embodiments disclosed herein is an acoustic resonator package having hermeticity between a substrate and a cap, to effectively protect an acoustic resonator therein. An acoustic resonator package according to this disclosure may minimize external influences to improve reliability of acoustic resonator package.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator package, comprising:
    a substrate;
    an acoustic resonator disposed on the substrate;
    a cap disposed on the substrate and the acoustic resonator; and
    a bonding portion bonding the substrate and the cap to each other,
    wherein the cap comprises a central portion accommodating the acoustic resonator, and an outer portion disposed outside of the central portion and having a bonding surface,
    wherein the outer portion comprises protrusions in contact with the bonding portion, and at least one trench disposed between the protrusions,
    wherein the acoustic resonator package further comprises a first protective layer and a second protective layer, the first protective layer and the second protective layer being disposed on a region of the bonding surface formed on each of the protrusions, and
    wherein, in portions of the protrusions in contact with the bonding portion, the first protective layer is disposed directly on the second protective layer in an area parallel to the bonding surface.

2. The acoustic resonator package of claim 1, wherein a thickness difference between the outer portion and the central portion is greater than a depth of the at least one trench.

3. The acoustic resonator package of claim 1, wherein the first protective layer is a conductive layer comprising any one or any combination of any two or more of chromium (Cr), titanium (Ti), titanium nitride (TiN), tantalum (Ta), tantalum nitride (TaN), nickel (Ni), molybdenum (Mo), and titanium tungsten (TiW).

4. The acoustic resonator package of claim 1, wherein the second protective layer comprises either one or both of an oxide of Si, Al, or Ti and a nitride of Si, Al, or Ti.

5. The acoustic resonator package of claim 1, wherein an average thickness of the second protective layer is less than ½ of an average width of the trench.

6. The acoustic resonator package of claim 1, wherein the first protective layer is disposed only on the region of the bonding surface formed on each of the protrusions.

7. The acoustic resonator package of claim 6, wherein the second protective layer is disposed inside the trench.

8. The acoustic resonator package of claim 1, wherein the first protective layer is disposed on a region of the bonding surface formed inside the trench.

9. The acoustic resonator package of claim 1, wherein the second protective layer entirely covers the first protective layer.

10. The acoustic resonator package of claim 1, wherein the bonding portion entirely covers the first protective layer.

11. The acoustic resonator package of claim 1, wherein the first protective layer is disposed between the bonding surface and the second protective layer.

12. The acoustic resonator package of claim 1, wherein the first protective layer is disposed on the second protective layer.

13. The acoustic resonator package of claim 1, wherein the bonding portion does not comprise an alloy.

14. An acoustic resonator package, comprising:
a substrate;
an acoustic resonator disposed on the substrate;
a cap disposed on the substrate and the acoustic resonator;
a bonding portion bonding the substrate and the cap to each other; and
a through-silicon via (TSV) hole passing through the cap,
wherein the cap comprises a central portion accommodating the acoustic resonator, and a connection portion having a bonding surface connected to the bonding portion,
wherein the connection portion comprises protrusions disposed to contact the bonding portion, and at least one trench disposed between the protrusions, and
wherein the acoustic resonator package further comprises a first protective layer and a second protective layer, the first protective layer and the second protective layer being disposed on a region of the bonding surface formed on each of the protrusions.

15. The acoustic resonator package of claim 14, wherein the TSV hole comprises a connection electrode, and
wherein the connection electrode is in contact with the bonding portion.

16. The acoustic resonator package of claim 14, wherein the TSV hole comprises a connection electrode, and
wherein the second protective layer extends between the connection electrode and the connection portion.

17. The acoustic resonator package of claim 14, wherein an average thickness of the second protective layer is less than ½ of an average width of the trench.

18. The acoustic resonator package of claim 14, wherein the bonding portion does not comprise an alloy.

19. The acoustic resonator package of claim 14, wherein the first protective layer is disposed only on the region of the bonding surface formed on each of the protrusions.

20. The acoustic resonator package of claim 14, wherein the second protective layer is disposed inside the trench.

21. The acoustic resonator package of claim 14, wherein the first protective layer is disposed on a region of the bonding surface formed inside the trench.

22. The acoustic resonator package of claim 14, wherein the second protective layer entirely covers the first protective layer.

23. The acoustic resonator package of claim 14, wherein the bonding portion entirely covers the first protective layer.

24. The acoustic resonator package of claim 14, wherein the first protective layer is disposed between the bonding surface and the second protective layer.

25. The acoustic resonator package of claim 14, wherein the first protective layer is disposed on the second protective layer.

* * * * *